United States Patent [19]

Burke et al.

[11] Patent Number: 4,637,448

[45] Date of Patent: * Jan. 20, 1987

[54] METHOD FOR PRODUCTION OF COMBUSTION TURBINE BLADE HAVING A SINGLE CRYSTAL PORTION

[75] Inventors: Michael A. Burke, Pittsburgh; Cyril G. Beck, Monroeville, both of Pa.

[73] Assignee: Westinghouse Electric Corp., Pittsburgh, Pa.

[*] Notice: The portion of the term of this patent subsequent to Sep. 10, 2002 has been disclaimed.

[21] Appl. No.: 644,751

[22] Filed: Aug. 27, 1984

[51] Int. Cl.[4] .............................................. B22D 27/02
[52] U.S. Cl. ................................... 164/122.2; 164/499
[58] Field of Search .................... 164/499, 122, 147.1, 164/122.1, 122.2; 148/39

[56] References Cited

U.S. PATENT DOCUMENTS 3,494,709  2/1970  Pieurcey .
3,695,941  10/1972  Green et al. .
3,790,303  2/1974  Endres .
3,981,345  9/1976  Alberny et al. .
4,307,769  12/1981  Hauser et al. .

OTHER PUBLICATIONS

ASM, Metals Handbook; Atlas of Microstructure of Industrial Alloys; 8th ed.

Primary Examiner—Nicholas P. Godici
Assistant Examiner—G. M. Reid
Attorney, Agent, or Firm—R. A. Stoltz

[57] ABSTRACT

This is a process of fabricating turbine blades for combustion turbines. It is an improvement to the type of process where a mold containing molten metal is cooled in a controlled fashion such that solidification occurs slow enough to allow single crystal growth beginning at the airfoil end. In the improved process solidification is monitored and magnetic mixing of the remaining molten metal is started at approximately the beginning of solidification of said root section and at approximately the same time the rate of cooling of said blade is increased to a rate faster than at which single crystal growth occurs. Grain boundary strengthener (preferably carbon) can be added at approximately the same time mixing is begun. A blade is produced with a single crystal airfoil section and a fine grained root section and without a substantially inhomogeneous portion at the interface between the airfoil and root sections.

2 Claims, 6 Drawing Figures

METHOD FOR PRODUCTION OF COMBUSTION TURBINE BLADE HAVING A SINGLE CRYSTAL PORTION

CROSS REFERENCE TO RELATED APPLICATION

A method for producing a combustion turbine blade having a directionally solidified structure in the airfoil section and a fine grained, non-directionally solidified structure in the root section is described in related application Ser. No. 617,458, filed June 5, 1984 and assigned to the same assignee. This differs from the instant invention in that the directionally solidified airfoil portion has multiple crystals rather than a single crystal.

BACKGROUND AND SUMMARY OF THE INVENTION

This is a method for making turbine blades for combustion turbines, including aircraft turbines, marine turbines, and land-based gas turbines. This invention utilizes a two step solidification to produce a fine grained (non-single crystal) structure in the root section and a single crystal structure in the airfoil section.

Gas turbine engines operate by extracting energy from high temperature, high pressure gas as it expands through the turbine section. The actual rotating components which are driven by the gas are generally manufactured from nickel-based superalloys and are commonly known as blades. They consist, as shown in FIG. 1, of a contoured airfoil which is driven by the hot gas stream and of a machined root which connects to the turbine rotor. Due to the nature of the carnot cycle, gas turbines operate more efficiently at higher temperatures and there has thus become a demand for materials which are able to withstand higher temperatures. The major mechanical modes of failure for turbine blades, such as in aircraft engines and in land-based turbine generators, at high temperatures have been thermal fatigue and the lack of creep rupture resistance. Both of these problems may be reduced by elimination of grain boundaries which are transverse to the major stress axis. Thus, single crystal and directionally solidified blades are known to display significantly improved high temperature strength.

While large grain sizes improve the desired properties in the very high temperature regime, at low temperatures certain mechanical properties are improved by lower grain size. Specifically, the root section of a turbine blade runs at considerably lower temperature than the airfoil and is, essentially, subjected to fatigue loading. Consequently, the optimum structure for airfoil and root sections of the blades are very different and, in conventional airfoils, some compromise must be accepted in at least one of these sections. The optimum properties would be obtained if a hybrid blade structure were produced with a directionally solidified airfoil and a fine grained root section.

In U.S. Pat. No. 4,184,900, issued Jan. 22, 1980 to Erickson et al., two different directionally solidified sections are produced to obtain different properties in the airfoil and root sections. In U.S. Pat. No. 3,790,303, issued Feb. 5, 1974 to Endres, a eutectic alloy is used to produce a hybrid turbine blade (bucket) having an airfoil which is directionally solidified and a non-oriented structure in the root. It should be noted that Endres' eutectic composition avoids composition inhomogenuities which would result if non-eutectic compositions were used in such a method.

In U.S. Pat. No. 3,695,941 to Green discloses a method of preparing solid eutectic material by controlled solidification from the melt including the application of a steady directional magnetic field to the liquid-solid interface. During exposure of the melt to the field, no external source of electric current is electrically connected to the material. The Piercey U.S. Pat. No. 3,494,709 issued Feb. 10, 1970 discloses a single crystal metallic part for a gas turbine. The whole part, including the root, is single crystal. The Alberney U.S. Pat. No. 3,981,345 discloses a method for continuously casting metal in which the metal is subjected to a magnetic field during solidification.

This invention is a turbine blade having a hybrid grain construction and which is fabricated using alloy compositions which are non-eutectic. The airfoil sections are single crystal while the root section has a fine grained, non-directionally solidified structure.

The process utilizes solidification at a slow enough rate to allow growth of the single crystal beginning at the airfoil end, with monitoring of the solidification. When the solidification reaches the interface between the airfoil and root sections, magnetic stirring is commenced to eliminate the inhomogeneous zone adjacent to the just-solidified portion. Cooling is then increased to a rate faster than that at which either growth of a single crystal or directional solidification occurs. Grain boundary strengthener (preferably carbon) is preferably added at about the same time stirring is begun. Thus, a blade is produced with a single crystal airfoil section and a fine grained root section, and without a substantially inhomogeneous portion at the interface between the airfoil and root sections.

BRIEF DESCRIPTION OF THE DRAWINGS

The invention can be best understood by reference to the following drawings in which.

DESCRIPTION OF THE PREFERRED EMBODIMENTS

Figure 1:
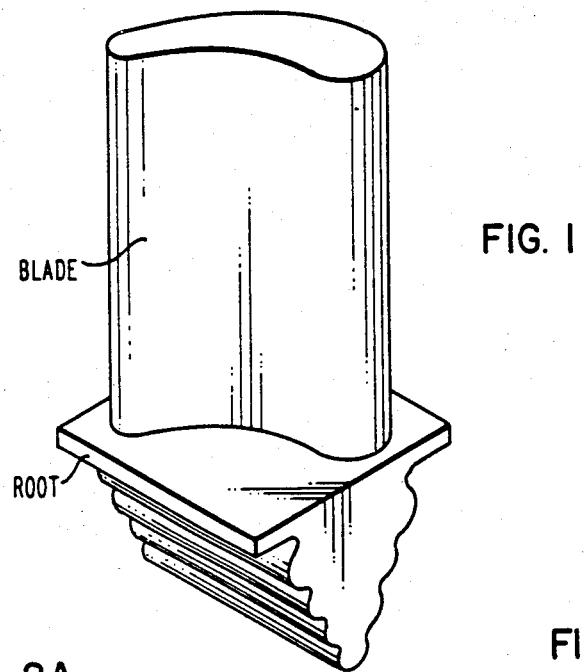
FIG. 1 shows a typical turbine blade having airfoil and root sections.
Figure 2A:
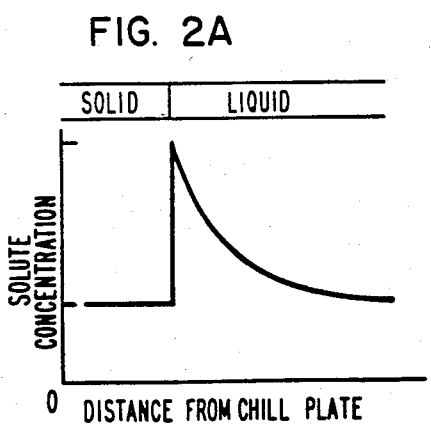
FIG. 2 shows a series of three graphs showing the solute rich band during solidification and the inhomogenuity resulting from an increase in solidification velocity.
Figure 2B:
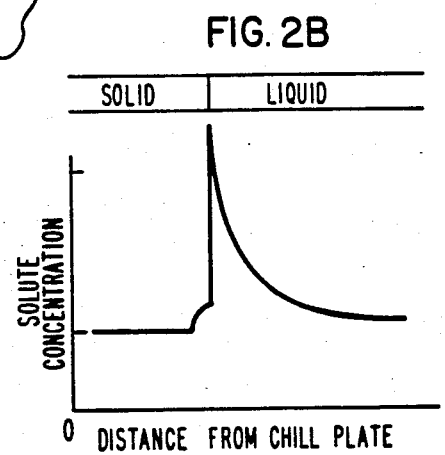
Figure 2C:
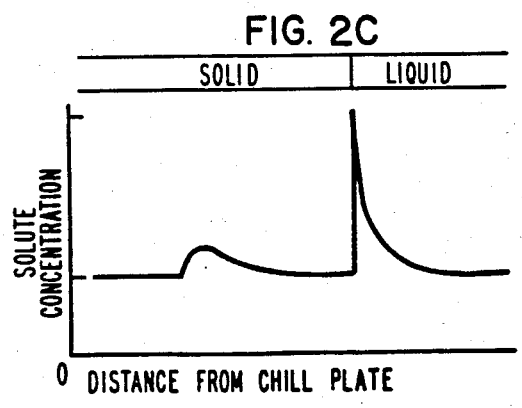

The prior art technology for producing a single crystal airfoil with a fine grained root section was impractical for non-eutectic alloys, as a serious compositional inhomogenuity with poor mechanical properties was produced at the interface between the airfoil and the root. As the solidification progresses as shown in FIG. 2, if a blade of non-eutectic alloy with a single crystal airfoil and a fine grained root were produced without using this invention, initially (FIG. 2A), with the blade section under conditions conducive to growth of a single crystal (low growth rate, high thermal gradient) and then the root section (FIG. 2C) with an increased growth rate for solidification of the root section, it is found that at the region which was solidifying when the rate change was affected (FIG. 2B), there is a significant increase in solute content (the left-hand bump on the curve of FIG. 2C; this inhomogeneous "bump" is effectively eliminated by this invention). Most nickel-based superalloys which are commonly used for gas turbine blading are non-eutectic. On such blades, this inhomogenuity would produce a region of significantly inferior mechanical properties.

To avoid the problem of a compositional inhomogenuity zone in the region where a single crystal airfoil is joined with a fine grained root structure, the present invention utilizes magnetic stirring to substantially eliminate such a zone. The magnetic stirring mixes the solute rich band in the relatively massive, still molten root section, thus avoiding any significant change of composition. As used herein, the term "inhomogenous portion" means solute rich and does not include changes in composition due to intentional additions during solidification (such as additions of grain boundary strengtheners).

Magnetic stirring is based on the principle that an electrical conductor lying in a magnetic field experiences a force normal to the plane that contains the current vector and the magnetic field vector. If the conductor is a liquid, the force causes shearing and a stirring effect is produced. Magnetic stirring has been used, for example, in continuous casting as noted in U.S. Pat. No. 4,256,165, issued Mar. 17, 1981 to Axel von Starck et al.

This invention utilizes magnetic stirring to redistribute the solute enrichment which occurred ahead of the solidifying single crystal airfoil to essentially prevent the inhomogeneous zone when the cooling rate is increased to produce the fine grained structure desired in the root.

Figure 3A:
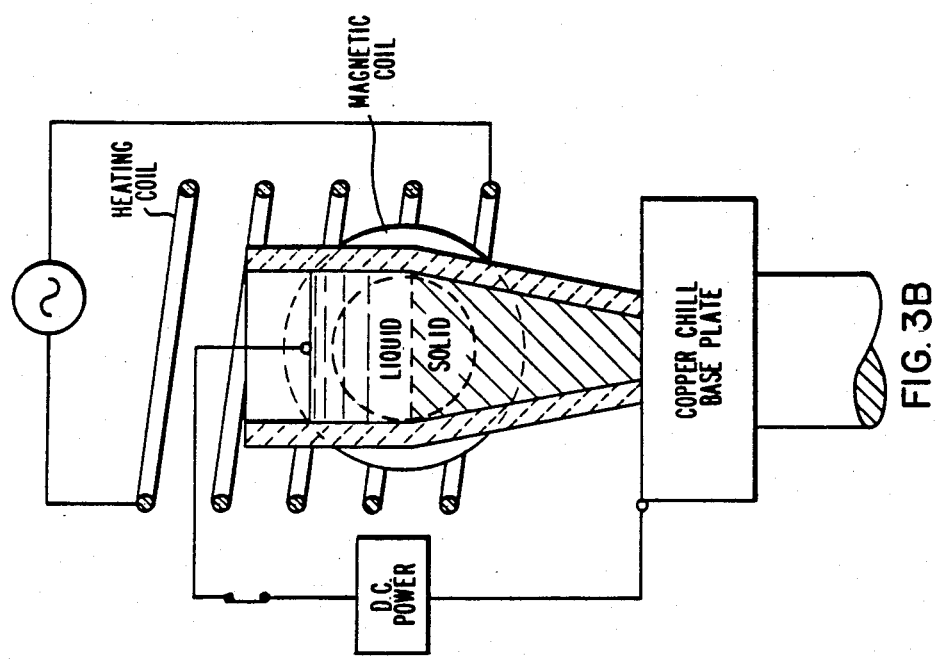
FIG. 3 shows growth of a single crystal by controlled withdrawal from a furnace.
Figure 3B:
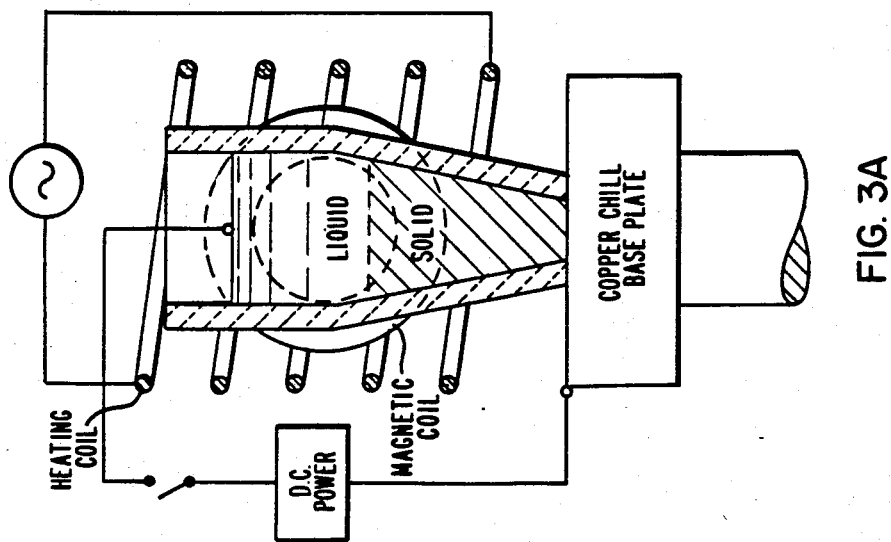

Growth of a single crystal is described in the aforementioned U.S. Pat. No. 3,494,709 to Piercey. It can be accomplished, for example, as shown in FIG. 3 where solidification proceeds from a copper chill base plate and controlled solidification is produced by slowly removing the base plate and the mold from the hot zone of the furnace. Here the root section is towards the top and the airfoil is removed from the furnace first. More rapid solidification may be affected by increasing the rate of removal. In order to produce a homogenous fine grain structure in the root of the blades, the magnetic stirring should be started essentially simultaneously with the increase in growth rate. Thus, solidification begins with the airfoil where growth occurs under relatively slow removal and there is only minor mixing of the liquid by natural convection. As the mold is withdrawn, the solidification front reaches the airfoil-root interface. At this point, the withdrawal rate is increased to above that at which single crystal growth occurs and the magnetic stirring is begun (essentially simultaneously or just prior to the increase in withdrawal rate). The magnetic stirring is begun by activating the system to pass electric current through the liquid and also through the magnetic coils (to produce the required magnetic field). In this case the more rapid solidification which produces a finer, more equiaxed, grain structure occurs due to the more rapid removal. The solute buildup ahead of the advancing interface is dispersed into the liquid by the forced magnetic stirring and an essentially chemically homogeneous structure is produced.

Stirring of the melt is accomplished since any current carrying conductor lying in a magnetic field is subject to a force which is orthogonal to the field and current. Under the action of the stirring not only is the concentration profile eliminated but the temperature gradient in the melt is also homogenized. Consequently, the dendrites of the solidified material become superheated not only due to the thermal homogenization but also constitutionally. Since the dendrites will be cored this constitutional superheating (an analogue of the well known "constitutional super cooling" effect) is most severe near the roots of the dendrites and, thus, as "melt-back" occurs to change the system towards equilibrium, the dendrites become necked and under the force due to the DC current and the magnetic field can break off and be swept away under the flow of the magnetic stirring. The withdrawal rate should then be sufficiently rapid to ensure a sufficient cooling rate that the broken-off dendrite tips do not dissolve into the melt but remain in the solid state to exist as viable nuclei for the initiation of equiaxed grain solidification.

An additional benefit of utilizing magnetic stirring can be in the incorporation of one or more grain boundary strengthening elements (i.e., "carbide formers" C, B, Zr, Mo, W, and Ta). Since single crystal alloys do not require grain boundary strengthening such elements which provide this strength are generally not incorporated into the single crystal alloy chemistry. However, although the single crystal portion of the blade will not require the benefit of grain boundary strengthening elements, the equiaxed section is improved by the incorporation of the elements which will produce the strengthening effect of grain boundary "carbides". Casting a blade from an alloy chemistry containing the grain boundary strengthening elements aggravates the difficulties of producing a single crystal casting. The use of magnetic stirring permits the addition and homogeneous distribution of such elements at the desired point in time during the solidification process of such a blade.

In this way, turbine blades can be produced which have single crystal structures in the airfoil, but fine grained structures in the root section utilizing practical, non-eutectic alloys, without creating a band of solute rich composition where the solidification rate was increased (at the root-airfoil interface).

The particular configuration and method of controlling the cooling rate and also the configuration for producing magnetic stirring, are, of course, examples, and other directional solidification and magnetic stirring methods can be used. Thus, the invention is not to be construed as limited to the particular forms described herein, since these are to be regarded as illustrative rather than restrictive. The invention is intended to cover all processes which do not depart from the spirit and scope of the invention.

We claim:

1. In a process of fabricating directionally solidified turbine blades for combustion turbines of the type wherein a mold containing molten metal is cooled in a controlled fashion such that solidification occurs slow enough to allow single crystal growth beginning at the airfoil end, the improvement comprising:

monitoring said solidification and starting magnetic mixing of the remaining molten metal at approximately the beginning of solidification of said root section and adding grain boundary strengthening elements at approximately the same time that said magnetic mixing is started and then increasing the rate of cooling of said blade to a rate faster than at which directional solidification occurs, whereby a blade is produced with a single crystal airfoil section and a fine grained root section and without a substantially inhomogeneous portion at the interface between the airfoil and root sections.

2. The process of claim 1, wherein said grain boundary strengthening element is carbon.

* * * * *